(12) United States Patent
Subramanian et al.

(10) Patent No.: US 11,935,892 B2
(45) Date of Patent: *Mar. 19, 2024

(54) SELF-ALIGNED GATE ENDCAP (SAGE) ARCHITECTURE HAVING GATE CONTACTS

(71) Applicant: Intel Corporation, Santa Clara, CA (US)

(72) Inventors: Sairam Subramanian, Portland, OR (US); Walid M. Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/862,305

(22) Filed: Jul. 11, 2022

(65) Prior Publication Data
US 2022/0352165 A1 Nov. 3, 2022

Related U.S. Application Data

(63) Continuation of application No. 16/294,210, filed on Mar. 6, 2019, now Pat. No. 11,424,245.

(51) Int. Cl.
*H01L 29/76* (2006.01)
*H01L 21/768* (2006.01)
(Continued)

(52) U.S. Cl.
CPC .... *H01L 27/0924* (2013.01); *H01L 21/76895* (2013.01); *H01L 21/76897* (2013.01);
(Continued)

(58) Field of Classification Search
CPC .......... H01L 27/0924; H01L 21/76895; H01L 21/76897; H01L 21/823821;
(Continued)

(56) References Cited

U.S. PATENT DOCUMENTS 11,424,245 B2 * 8/2022 Subramanian .............................. H01L 21/823821
2013/0187206 A1 7/2013 Mor
(Continued)

FOREIGN PATENT DOCUMENTS

WO    WO 2018063259    4/2018

OTHER PUBLICATIONS

Office Action from Taiwan Patent Application No. 109102991, dated Apr. 24, 2023, 7 pgs.
(Continued)

*Primary Examiner* — Theresa T Doan
(74) *Attorney, Agent, or Firm* — Schwabe, Williamson & Wyatt, P.C.

(57) ABSTRACT

Self-aligned gate endcap (SAGE) architectures having gate contacts, and methods of fabricating SAGE architectures having gate contacts, are described. In an example, an integrated circuit structure includes a gate structure over a semiconductor fin. A gate endcap isolation structure is laterally adjacent to and in contact with the gate structure. A trench contact structure is over the semiconductor fin, where the gate endcap isolation structure is laterally adjacent to and in contact with the trench contact structure. A local gate-to-contact interconnect is electrically connecting the gate structure to the trench contact structure.

25 Claims, 18 Drawing Sheets

(51) Int. Cl.
*H01L 21/8238* (2006.01)
*H01L 27/092* (2006.01)
*H01L 29/66* (2006.01)
*H01L 29/78* (2006.01)
*H01L 29/94* (2006.01)
*H01L 31/062* (2012.01)

(52) U.S. Cl.
CPC ............ *H01L 21/823821* (2013.01); *H01L 21/823828* (2013.01); *H01L 21/823871* (2013.01); *H01L 21/823878* (2013.01); *H01L 29/66545* (2013.01); *H01L 29/66795* (2013.01); *H01L 29/785* (2013.01); *H01L 2029/7858* (2013.01)

(58) Field of Classification Search
CPC ..... H01L 21/823828; H01L 21/823871; H01L 21/823878; H01L 29/66545; H01L 29/66795; H01L 29/785; H01L 2029/7858; H01L 21/76834; H01L 21/76883; H01L 21/823431; H01L 27/0886; H01L 29/41791; H01L 21/823437; H01L 21/823481; H01L 21/823475; H01L 29/775
USPC ........................................................ 257/288
See application file for complete search history.

(56) References Cited

U.S. PATENT DOCUMENTS

2016/0233298 A1  8/2016  Webb et al.
2017/0018620 A1  1/2017  Liu

OTHER PUBLICATIONS

Notice of Allowance from Taiwan Patent Application No. 109102991, dated Oct. 31, 2023, 3 pgs.

* cited by examiner

SELF-ALIGNED GATE ENDCAP (SAGE) ARCHITECTURE HAVING GATE CONTACTS

CROSS-REFERENCE TO RELATED APPLICATIONS

This application is a continuation of U.S. patent application Ser. No. 16/294,210, filed on Mar. 6, 2019, the entire contents of which is hereby incorporated by reference herein.

TECHNICAL FIELD

Embodiments of the disclosure are in the field of integrated circuit structures and processing and, in particular, self-aligned gate endcap (SAGE) architectures having gate contacts, and methods of fabricating SAGE architectures having gate contacts.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features. Additionally, the constraints on including passive features among active devices have increased.

DESCRIPTION OF THE EMBODIMENTS

Figure 1:
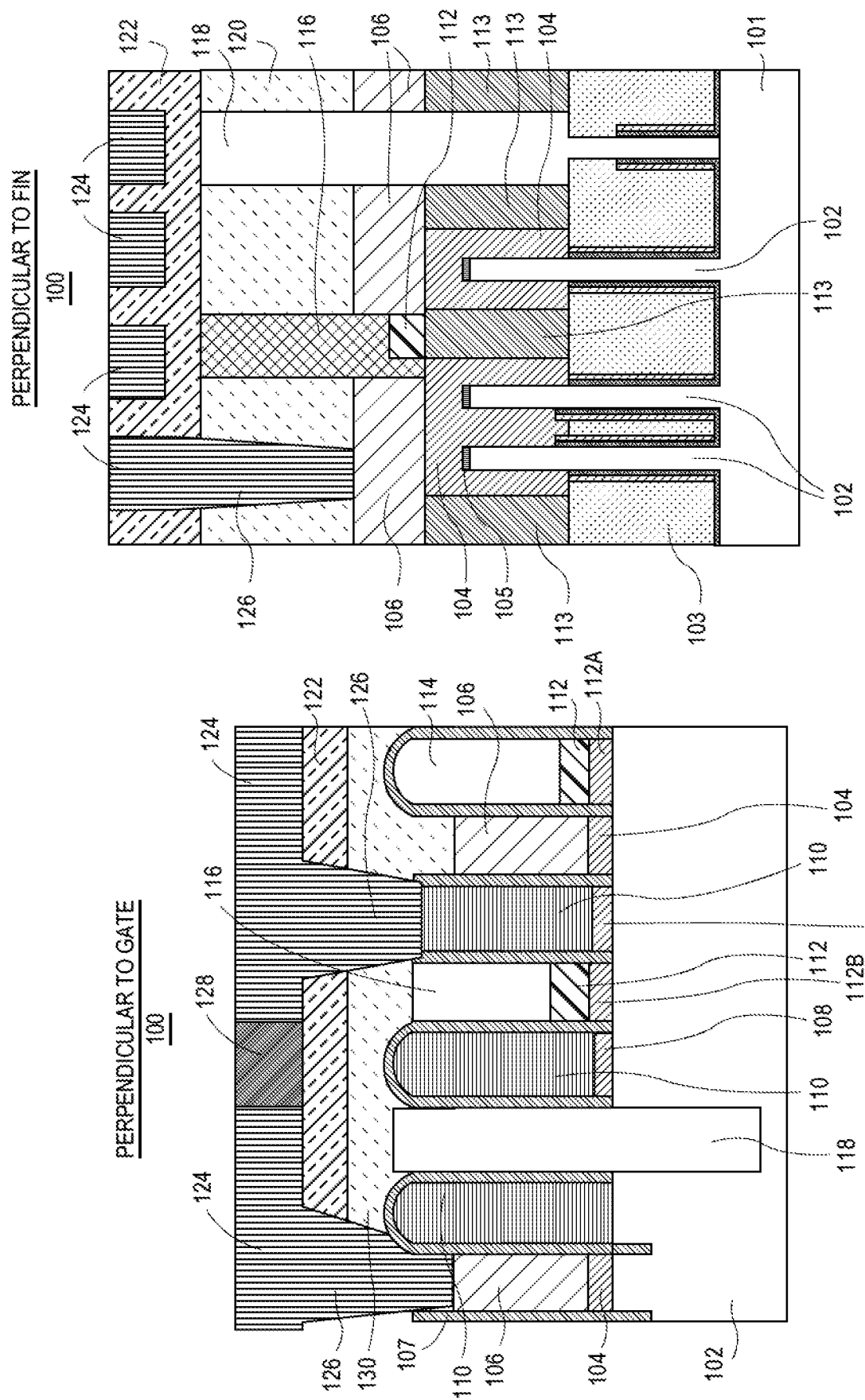
FIG. 1 illustrates cross-sectional views of an integrated circuit structure including a self-aligned gate endcap (SAGE) architecture.

Self-aligned gate endcap (SAGE) architectures having gate contacts, and methods of fabricating SAGE architectures having gate contacts, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments of the present disclosure are directed to integrated circuit structures or devices having one or more gate endcap structures (e.g., as gate isolation regions) of gate electrodes of the integrated circuit structures or devices. The gate endcap structures may be self-aligned gate endcap (SAGE) walls formed between and in parallel alignment with a plurality of semiconductor fins. In an embodiment, the fabrication of gate contacts for a SAGE architecture is described. In an embodiment, the formation of local gate-to-trench contact interconnects for a SAGE architecture is described.

To provide context, logic devices are aggressively scaled in dimension, creating fabrication and yield challenges for gate and contact end cap patterning. Today's state of the art processes rely on a self-aligned gate endcap (SAGE) architecture that provides a potential landing spot for a gate or contact plug. Plug patterning involves etching holes into a sacrificial hardmask or other etchable film, and filling the resulting hole with an insulating material. The bulk sacrificial film is then removed prior to metal fill. Local interconnects are created in locations where there are no plugs by fabricating a metal structure that crosses over a SAGE wall in the absence of gate/contact plugs.

With hyper-scaling of logic devices, on chip real estate to route all the interconnects needed for functionality is at a premium, leading to larger footprints which then consume the scaling margin or require the addition of more metal layers causing increased capacitance and leading to switching delays and lower frequencies. Furthermore, multiple mask patterning solutions also create process integration challenges and defects by introducing a large number of process operations which in turn lead to reduced yield. Embodiments described herein may be implemented to address issues associated with adding additional gate-to-contact local interconnects in an ultra-scaled process technology.

As a comparative example, FIG. 1 illustrates cross-sectional views of an integrated circuit structure including a self-aligned gate endcap (SAGE) architecture. A cross-sectional view representing a "Perpendicular to Gate" view is on the left-hand side of FIG. 1, and a cross-sectional view representing a "Perpendicular to Fin" view is on the right-hand side of FIG. 1. It is to be appreciated that the arrangement on the left-hand side does not represent a flush cut through the fin but rather shows the structures viewable when observed in a perspective taken along a single fin.

Referring to FIG. 1, an integrated circuit structure 100 includes semiconductor fins 102 protruding from a semiconductor substrate 101 and through a trench isolation region 103. Gate structures over the fins 102 include a gate electrode 104 and a local gate contact 106 on the gate electrode 104. Gate sidewall spacers 107 may also be included. Trench contact structures may include a first contact portion 108 and a second contact portion 110, or only the second contact portion 110, examples of both of which are depicted. A SAGE architecture includes a self-aligned wall (SAW) feature 112 on a SAGE structure 113 or other SAGE feature 112A or 112B. A contact plug 114 is on a first portion of the SAW feature 112, and a gate plug 116 is on a second portion of the SAW feature 112. A fin trim isolation structure 118 isolates a fin 102 into two different portions. Gate insulating cap layers 120 or other dielectric layer 130 may be include over the above described structures. An overlying inter-layer dielectric (ILD) material 122 includes metal lines 124 therein. Ones of the metal lines 124 may have associated conductive vias 126. A single metal line 126 may include a plug 128 therein to isolate two different portions of the single metal line 126.

With reference again to FIG. 1, a local gate to contact interconnect may be fabricated by excluding plug 128 from metal line 124. Thus, gate to contact (e.g., trench contact) interconnection is achieved by effectively joining a local gate contact portion 106 of a gate electrode with a second contact portion 110 of a trench contact through a metal lines 124 and associated conductive vias 126. Accordingly, local gate-to-contact interconnection is typically achieved in a BEOL layer such as a metal 0 or even a metal 1 layer.

By contrast to the structure of FIG. 1, one or more embodiments described herein involve the use of a self-aligned perpendicular grid of an insulating material that runs perpendicular to a gate or contact. An etchable insulating material is embedded in the self-aligned-gate-endcap (SAGE) grid. The intersection of the grid with a gate or contact will provide all possible locations of interconnects. Patterning schemes are then used to etch away the embedded insulators where interconnects are desired ultimately providing a gate metal or contact metal to "flow" through a SAGE structure.

Figure 2:
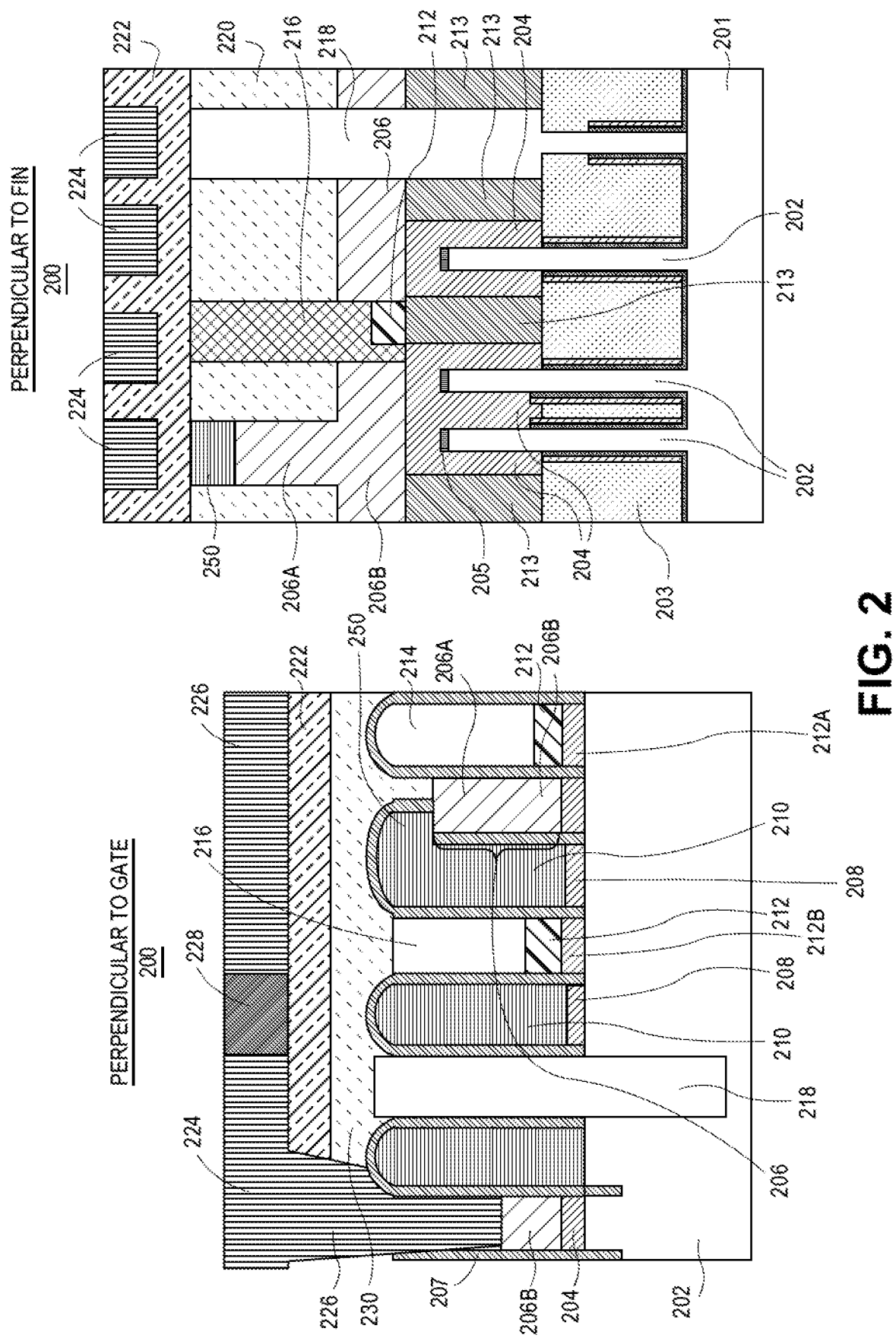
FIG. 2 illustrates cross-sectional views of an integrated circuit structure including a self-aligned gate endcap (SAGE) architecture having a gate contact, in accordance with an embodiment of the present disclosure.

As an exemplary structure, FIG. 2 illustrates cross-sectional views of an integrated circuit structure including a self-aligned gate endcap (SAGE) architecture having a gate contact, in accordance with an embodiment of the present disclosure. A cross-sectional view representing a "Perpendicular to Gate" view is on the left-hand side of FIG. 2, and a cross-sectional view representing a "Perpendicular to Fin" view is on the right-hand side of FIG. 2. It is to be appreciated that the arrangement on the left-hand side does not represent a flush cut through the fin but rather shows the structures viewable when observed in a perspective taken along a single fin.

Referring to FIG. 2, an integrated circuit structure 200 includes semiconductor fins 202 protruding from a semiconductor substrate 201. Gate structures over the fins 202 include a gate electrode 204 and a local gate contact 206A/B on the gate electrode 204. The local gate contact may include an upper narrower region 206A and a lower region 206B. A fin hardmask 205 may be between the fins 202 and the overlying gate stack, as is depicted, or may not be included. Gate sidewall spacers 207 may also be included. Trench contact structures may include a first contact portion 208 and a second contact portion 210, or only the second contact portion 210, examples of both of which are depicted. A local gate-to-contact interconnect 250 is included as a conductive contact between a gate electrode and a trench contact.

Referring again to FIG. 2, a SAGE architecture includes a self-aligned wall (SAW) feature 212 on a SAGE structure 213 or other SAGE feature 212A. A contact plug 214 is on a first portion of the SAW feature 212, and a gate plug 216 is on a second portion of the SAW feature 212. A fin trim isolation structure 218 isolates a fin 202 into two different portions. Gate insulating layers 220 or other dielectric layer 230 may be include over the above described structures. An overlying inter-layer dielectric (ILD) material 222 includes metal lines 224 therein. Ones of the metal lines 224 may have associated conductive vias 226. A single metal line 226 may include a plug 228 therein to isolate two different portions of the single metal line 226.

With reference to FIG. 2, in accordance with an embodiment of the present disclosure, an integrated circuit structure 200 includes a gate structure 204/206B/206A over a semiconductor fin 202. A gate endcap isolation structure 213 (and which may further include SAW 212) is laterally adjacent to and in contact with the gate structure 204/206B/206A, e.g., with portion 204. A trench contact structure 208/210 is over the semiconductor fin 202. The gate endcap isolation structure 213 is laterally adjacent to and in contact with the trench contact structure 208/210. A local gate-to-contact interconnect 250 is electrically connecting the gate structure 204/206B/206A to the trench contact structure 208/210.

In an embodiment, the integrated circuit structure 200 further includes a gate plug 216 over the gate endcap isolation structure 213/212. The gate plug 216 is laterally adjacent to and in contact with the gate structure 204/206B/206A, e.g., in contact with portion 206B. In one embodiment, the gate plug 216 has an uppermost surface co-planar with an uppermost surface of the local gate-to-contact interconnect 250, as is depicted. In one embodiment, the gate plug 216 is vertically misaligned with the gate endcap isolation structure 213, as is depicted. In one embodiment, the gate plug 216 has a width greater than a width of the gate endcap isolation structure 213, as is also depicted.

In an embodiment, the local gate-to-contact interconnect 250 is continuous with the trench contact structure 208/210, e.g., continuous with portion 210, as is depicted. In an embodiment, the gate structure 204/206B/206A includes a local gate contact 206B/206A. In one such embodiment, the local gate-to-contact interconnect 250 is on the local gate contact 206B/206A, e.g., on portion 206A, as is depicted.

In an embodiment, the integrated circuit structure 200 further includes a trench contact plug 214 over the gate endcap isolation structure 213/212. In one embodiment, the trench contact plug 214 is laterally adjacent to and in contact with the trench contact structure 208/210 into or out of the page of the left-hand illustration of FIG. 2. In an embodiment, the semiconductor fin 202 protrudes through a trench isolation region 203 above a substrate 201, as is depicted. In one such embodiment, the gate endcap isolation structure 213/212 is on the trench isolation region 203, e.g., 213 is on the trench isolation region 203, as is depicted.

With reference again to FIG. 2, in accordance with another embodiment of the present disclosure, an integrated circuit structure 200 includes a first gate structure (left 204/206B/206A) over a first semiconductor fin (left or middle 202). A second gate structure (right 204/206) is over a second semiconductor fin (right 202). A gate endcap isolation structure 213 (and which may further include SAW 212) is between the first and second semiconductor fins 202 and laterally between and in contact with the first and second gate structures. A first trench contact structure 208/210 is over the first semiconductor fin 202 and a second trench contact structure 208/210 is over the second semiconductor fin (e.g., into or out of the page of the right-hand illustration of FIG. 2). In one embodiment, the gate endcap isolation structure 212/213 is laterally between and in contact with the first and second trench contact structures 208/210. A local gate-to-contact interconnect 250 is electrically connecting the first gate structure 204/206B/206A to the first trench contact structure 208/210.

As an exemplary processing scheme, FIGS. 3A-3I illustrates cross-sectional views representing various operations in a method of fabricating an integrated circuit structure including a self-aligned gate endcap (SAGE) architecture having a gate contact, in accordance with an embodiment of the present disclosure. It is to be appreciated that the arrangements on the left-hand side do not represent a flush cut through the fin but rather shows the structures viewable when observed in a perspective taken along a single fin.

Figure 3A:
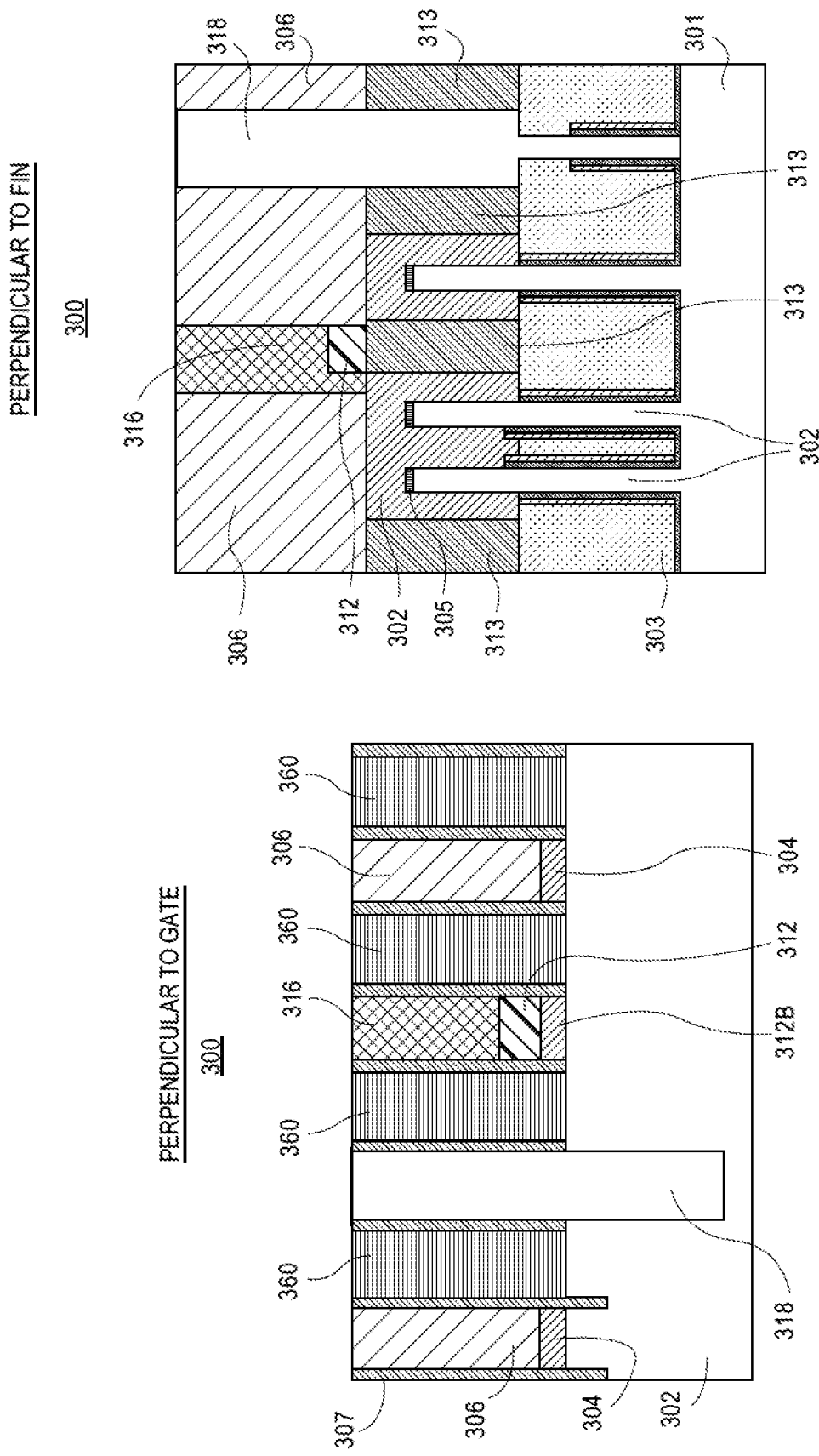
FIGS. 3A-3I illustrates cross-sectional views representing various operations in a method of fabricating an integrated circuit structure including a self-aligned gate endcap (SAGE) architecture having a gate contact, in accordance with an embodiment of the present disclosure.

Referring to FIG. 3A, a cross-sectional view representing a "Perpendicular to Gate" view is on the left-hand side, and a cross-sectional view representing a "Perpendicular to Fin" view is on the right-hand side. A starting structure 300 includes fins 302 protruding from a substrate 301 and above shallow trench isolation (STI) structures 303. Fins may have a hardmask 305 thereon, where the hardmask 305 may ultimately be retained or removed during fabrication of a final structure. Gate structures over the fins 302 include a gate electrode 304 and a local gate contact 306 on the gate electrode 304. Gate sidewall spacers 307 may also be included. A SAGE architecture includes a self-aligned wall (SAW) feature 312 on a SAGE structure 313 or other SAGE feature 312B. A gate plug 316 is on a portion of the SAW feature 312. A fin trim isolation structure 318 isolates a fin 302 into two different portions. Inter-layer dielectric material regions 360 are interleaved with gate structures and may represent eventual locations of trench contact structures.

Figure 3B:
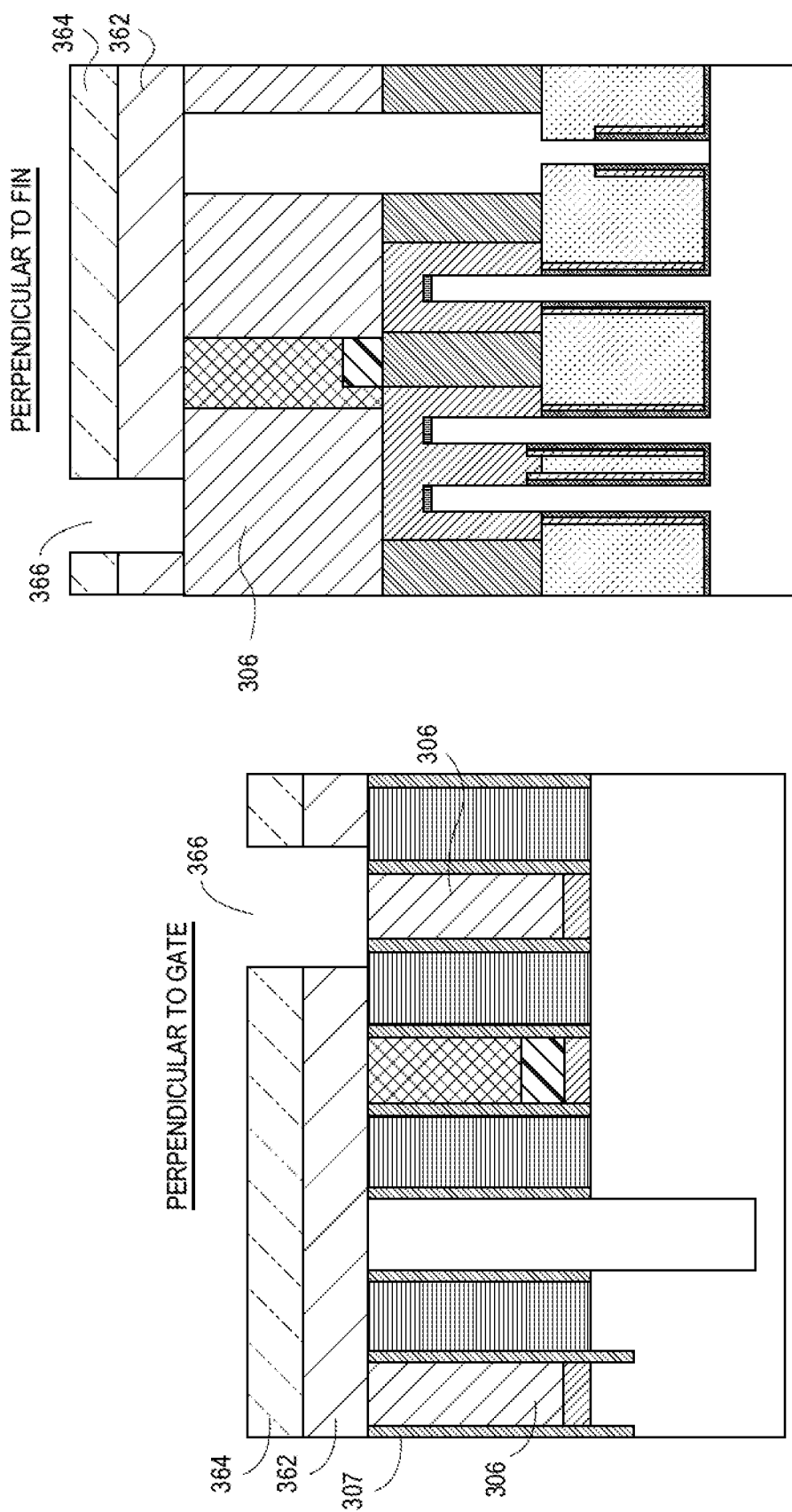

Referring to FIG. 3B, a cross-sectional view representing a "Perpendicular to Gate" view is on the left-hand side, and a cross-sectional view representing a "Perpendicular to Fin" view is on the right-hand side. At this stage, a first patterning mask 362 and a second patterning mask 364 are formed over the structure of FIG. 3A. An opening 366 is formed in the first patterning mask 362 and the second patterning mask 364 in a location where a local gate-to-contact interconnect is ultimately formed.

Figure 3C:
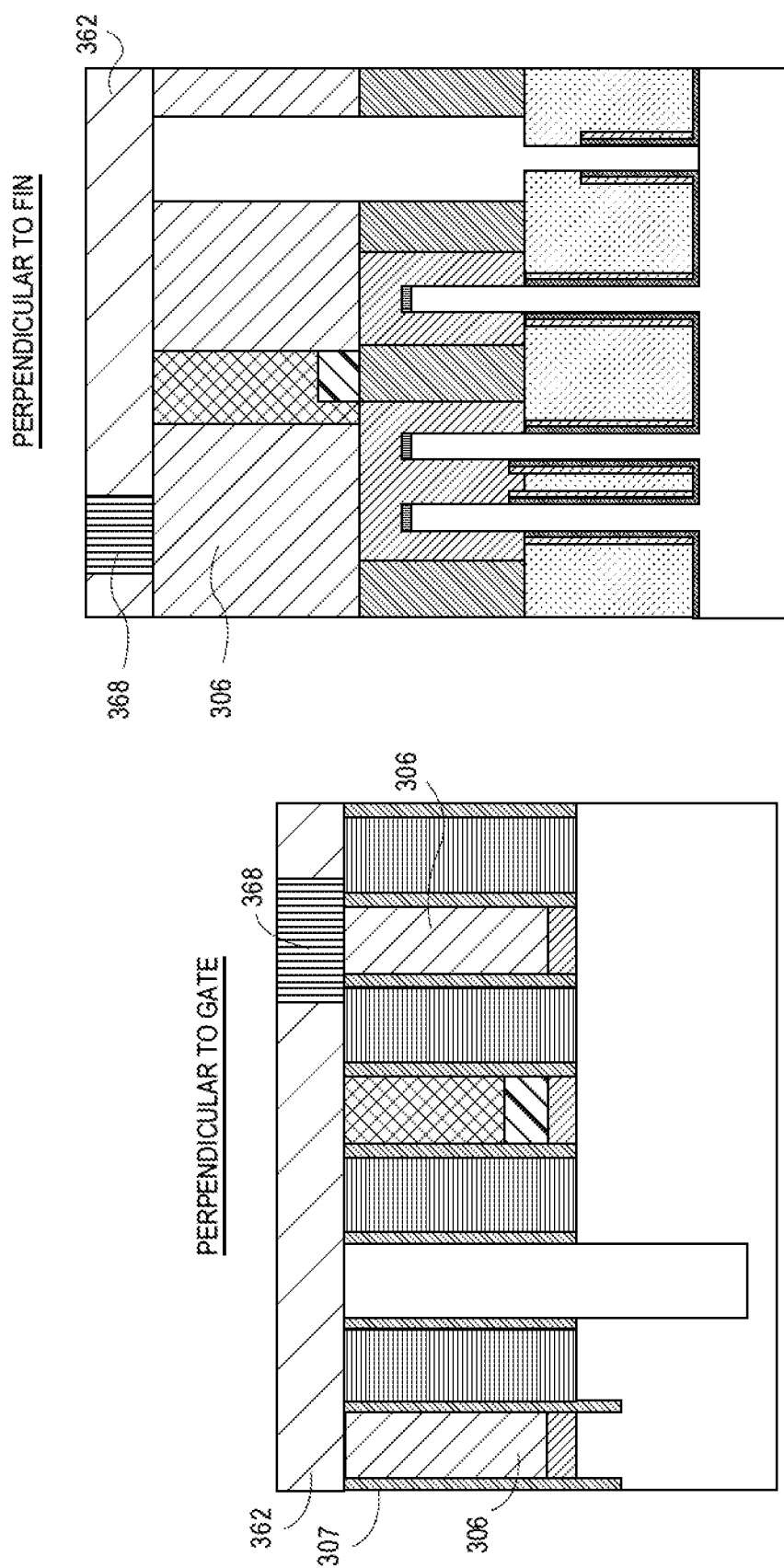

Referring to FIG. 3C, a cross-sectional view representing a "Perpendicular to Gate" view is on the left-hand side, and a cross-sectional view representing a "Perpendicular to Fin" view is on the right-hand side. At this stage, a blocking material 368 is formed in opening 366 of FIG. 3B in the location where a local gate-to-contact interconnect is ultimately formed. The second patterning mask 364 has been removed at this stage, e.g., by planarization, while the first patterning mask 362 is retained. The blocking material 368 is retained over a portion of a local gate contact 306 of a gate structure.

Figure 3D:
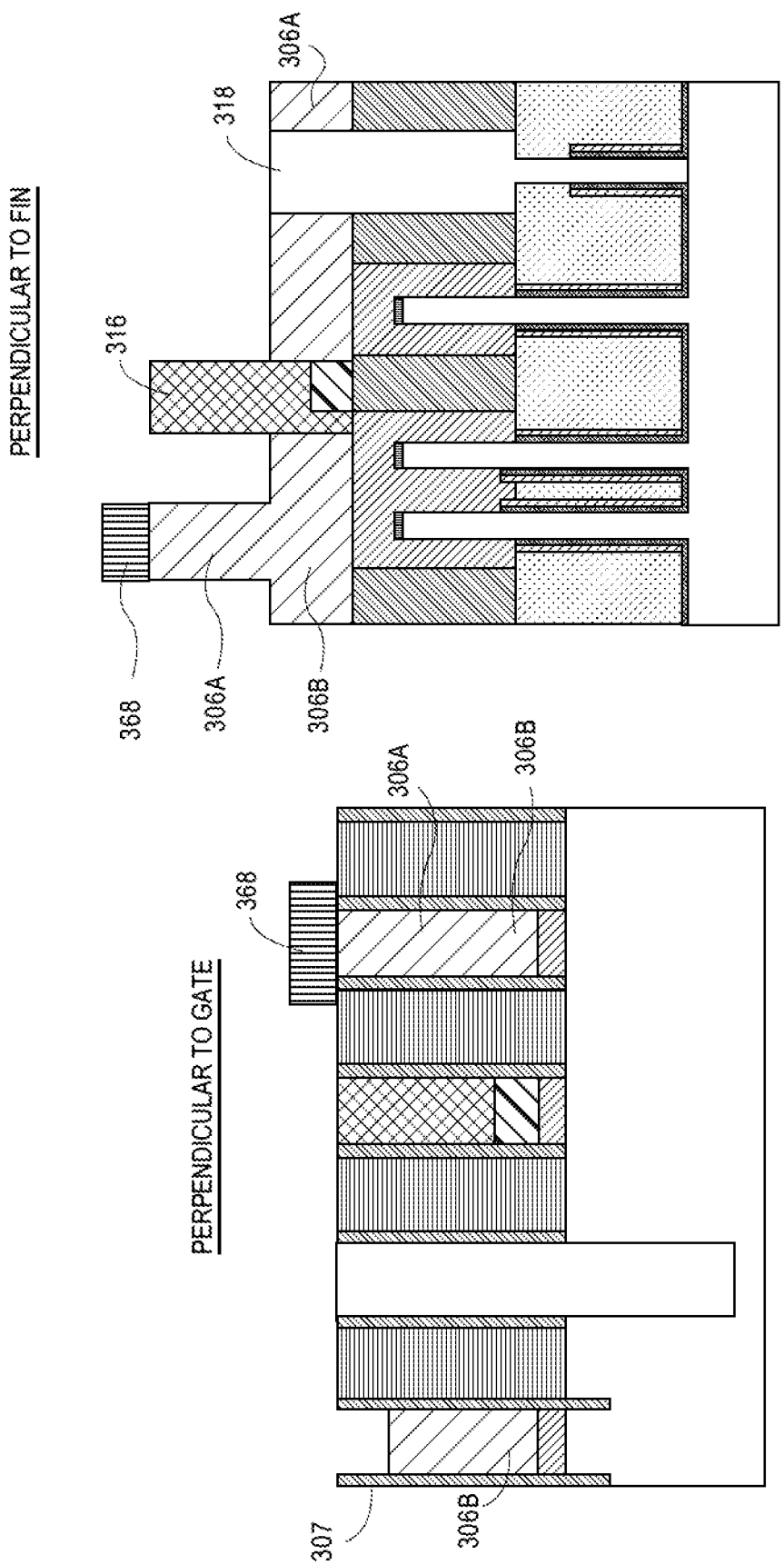

Referring to FIG. 3D, a cross-sectional view representing a "Perpendicular to Gate" view is on the left-hand side, and a cross-sectional view representing a "Perpendicular to Fin" view is on the right-hand side. At this stage, the first patterning mask 362 is removed. The local gate contact 306 is patterned using blocking material 368 as a mask to form a patterned local gate contact having an upper portion 306A and a lower portion 306B. The upper portion 306A of the patterned local gate contact is in the location where a local gate-to-contact interconnect is ultimately formed.

Figure 3E:
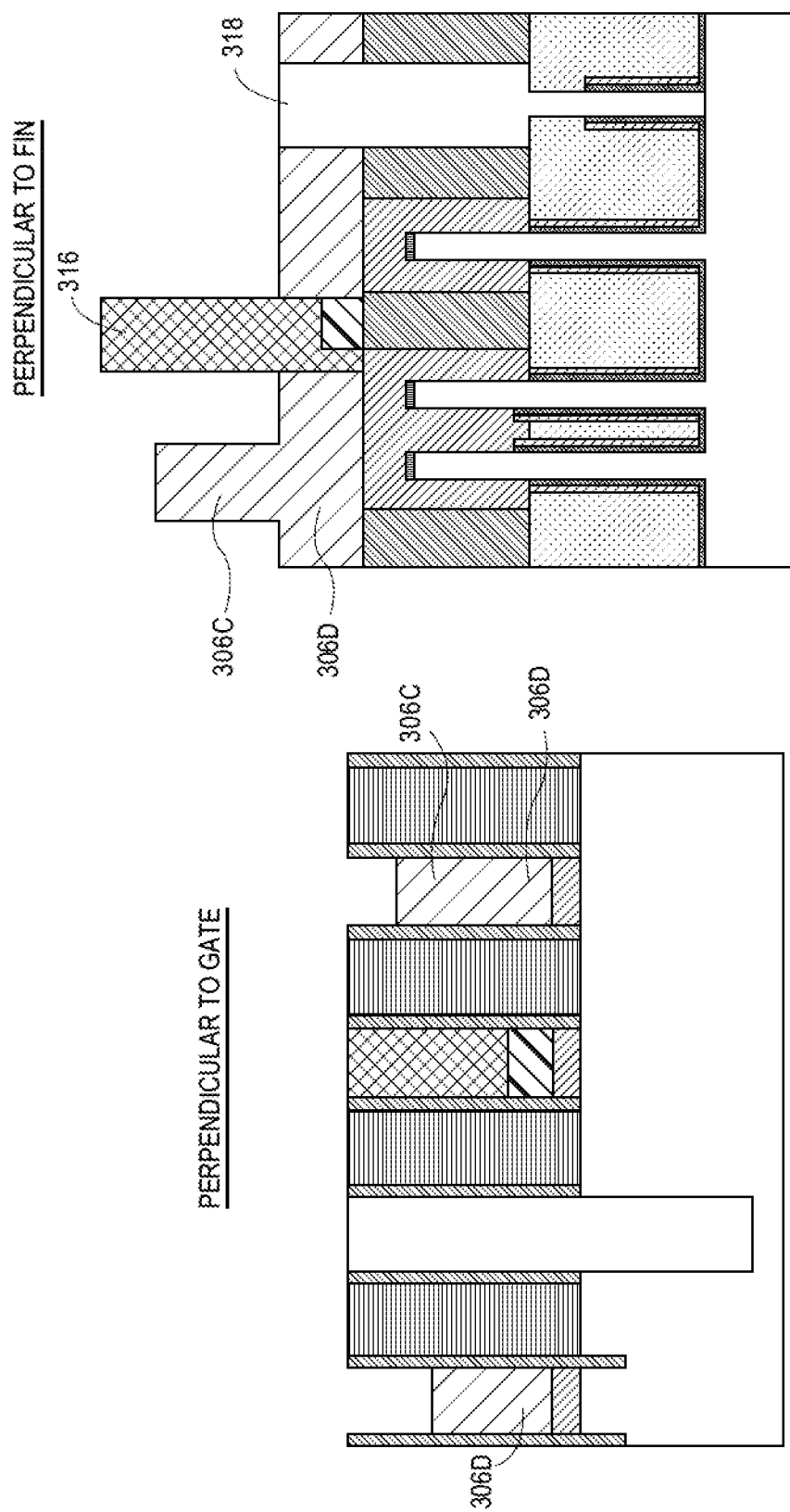

Referring to FIG. 3E, a cross-sectional view representing a "Perpendicular to Gate" view is on the left-hand side, and a cross-sectional view representing a "Perpendicular to Fin" view is on the right-hand side. At this stage, the blocking material 368 is removed from the structure of FIG. 3D. Upper portion 306A and lower portion 306B of the patterned local gate contacts are exposed to a further recessing process to form recessed patterned local gate contacts having an upper portion 306C and a lower portion 306D. In one embodiment, the recess process is a timed etch process.

Figure 3F:
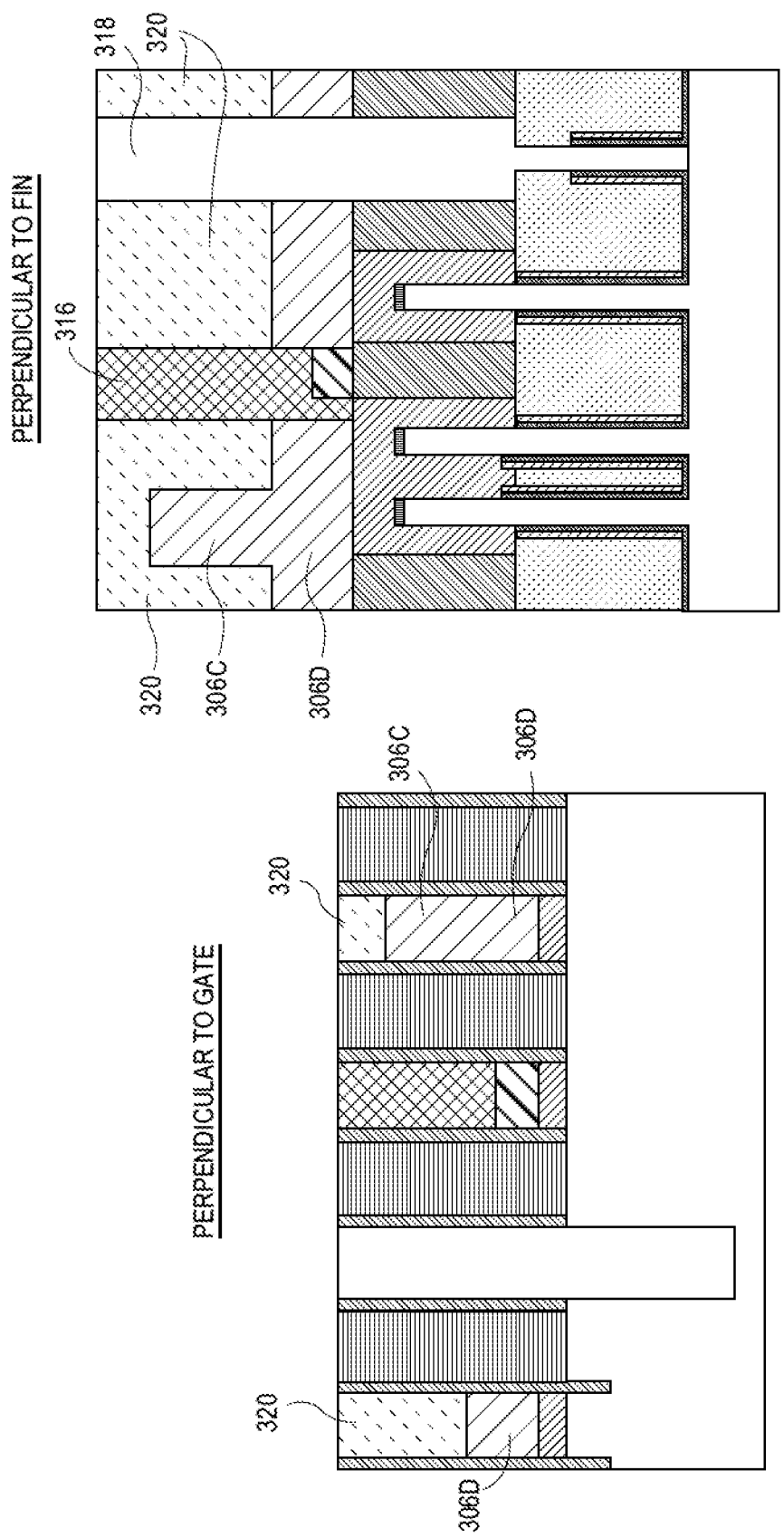

Referring to FIG. 3F, a cross-sectional view representing a "Perpendicular to Gate" view is on the left-hand side, and a cross-sectional view representing a "Perpendicular to Fin" view is on the right-hand side. At this stage, a gate insulating cap layer 320 is formed over the upper portion 306C and lower portion 306D of the recessed patterned local gate contacts. In one embodiment, gate insulating cap layer 320 is formed by depositing and then planarizing a hardmask material over the structure of FIG. 3E.

Figure 3G:
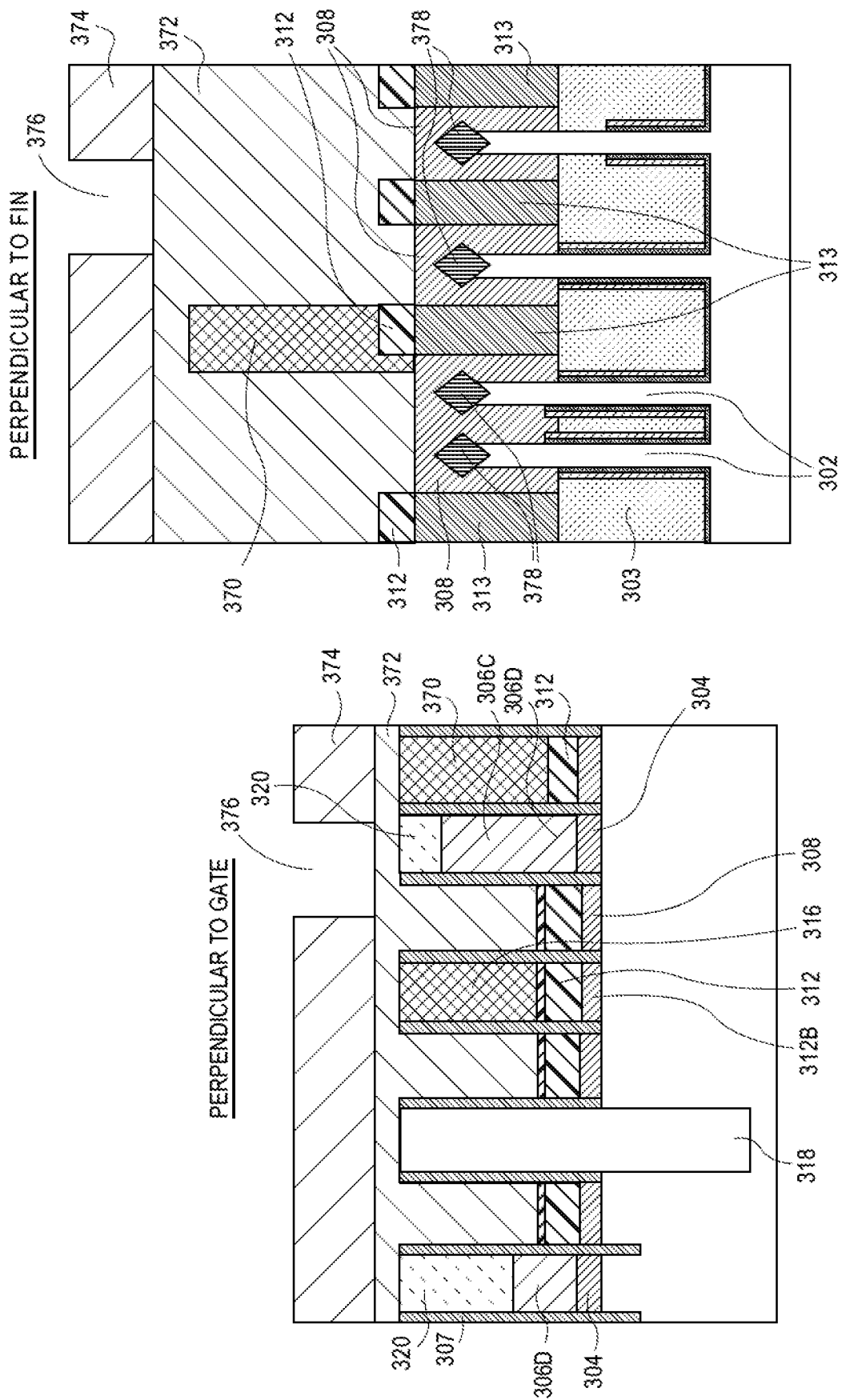

Referring to FIG. 3G, a cross-sectional view representing a "Perpendicular to Gate" view is on the left-hand side, and a cross-sectional view representing a "Perpendicular to Fin" view at Source/Drain (S/D) is on the right-hand side. At this stage, inter-layer dielectric material regions 360 are removed to form trench contact openings. A first contact portion 308 is subsequently formed in the trench contact openings, e.g., in a source or drain 378 location. A contact plug 370 may have been formed prior to the formation of first contact portion 308, as is depicted. A planarized sacrificial hardmask 372 is then formed over the remaining structure. A patterned mask 374 having an opening 376 therein is formed over the planarized sacrificial hardmask 372.

Figure 3H:
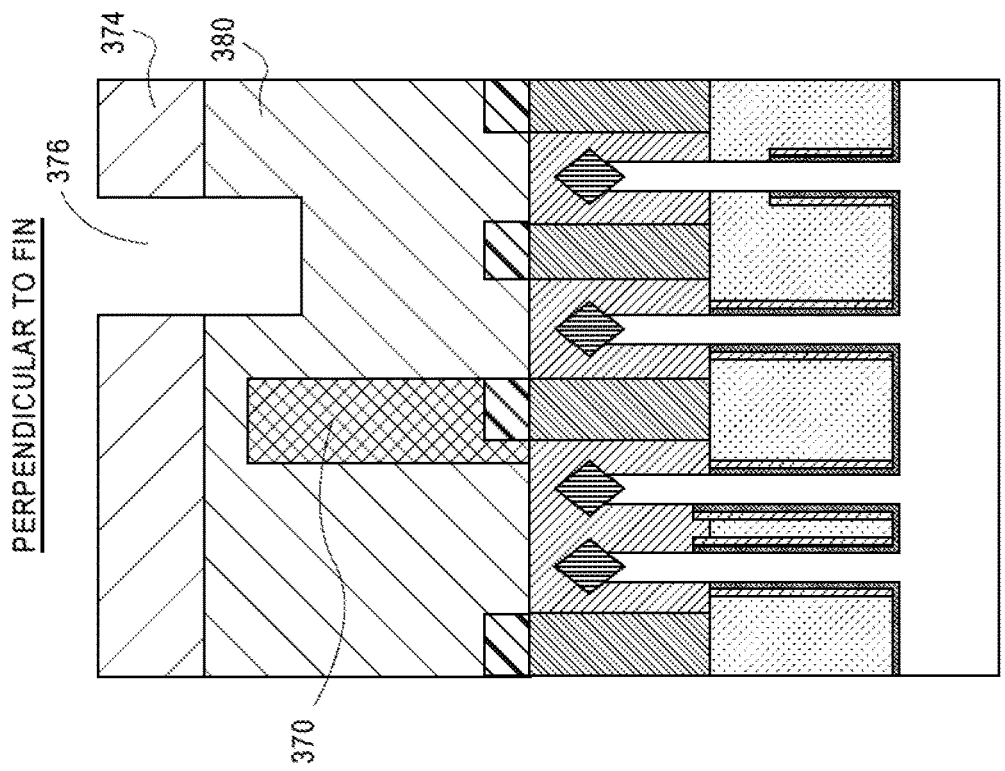
Figure 3H:
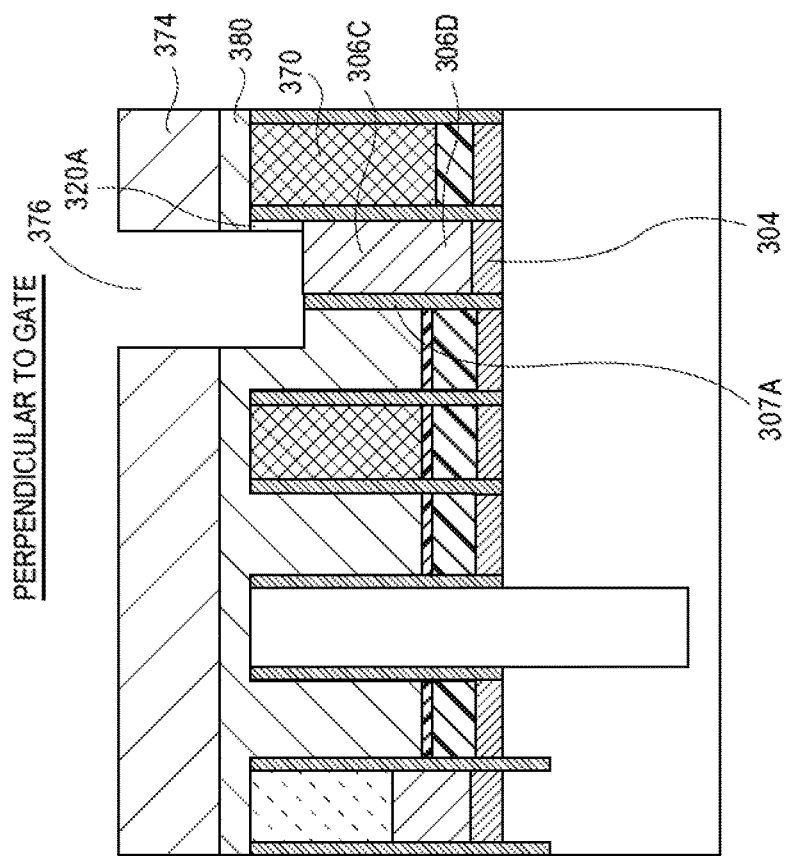

Referring to FIG. 3H, a cross-sectional view representing a "Perpendicular to Gate" view is on the left-hand side, and a cross-sectional view representing a "Perpendicular to Fin" view at Source/Drain (S/D) is on the right-hand side. At this stage, the planarized sacrificial hardmask 372 is patterned to form patterned sacrificial hardmask 380 using the patterned mask 374 having the opening 376. The pattern of opening 376 is extended to remove a portion of the gate insulating cap layer 320 of one of the gate structures. The patterning may be misaligned in that a portion 320A of the gate insulating cap layer is retained, while a portion of a corresponding gate spacer is patterned to form recessed spacer 307A, as is depicted.

Figure 3I:
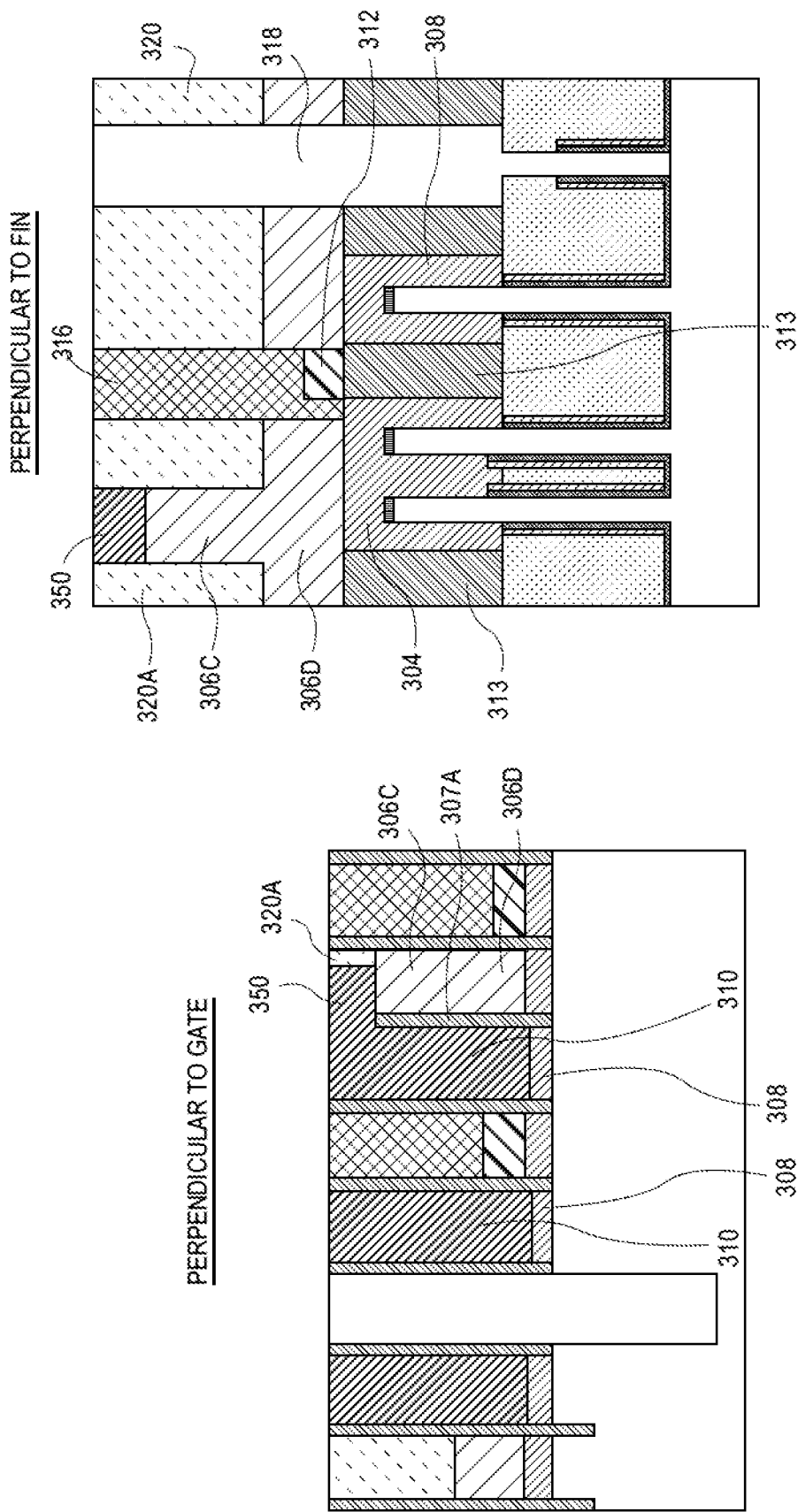

Referring to FIG. 3I, a cross-sectional view representing a "Perpendicular to Gate" view is on the left-hand side, and a cross-sectional view representing a "Perpendicular to Fin" view is on the right-hand side. At this stage, the patterned mask 374 and the patterned sacrificial hardmask 380 are removed from the structure of FIG. 3H. A second contact portion 310 is then formed to provide trench contact structures 308/310. The material of the second contact portion 310 also fills the location over the gate structure patterned in FIG. 3H. As a result, a local gate-to-contact interconnect 350 is formed.

Figure 4:
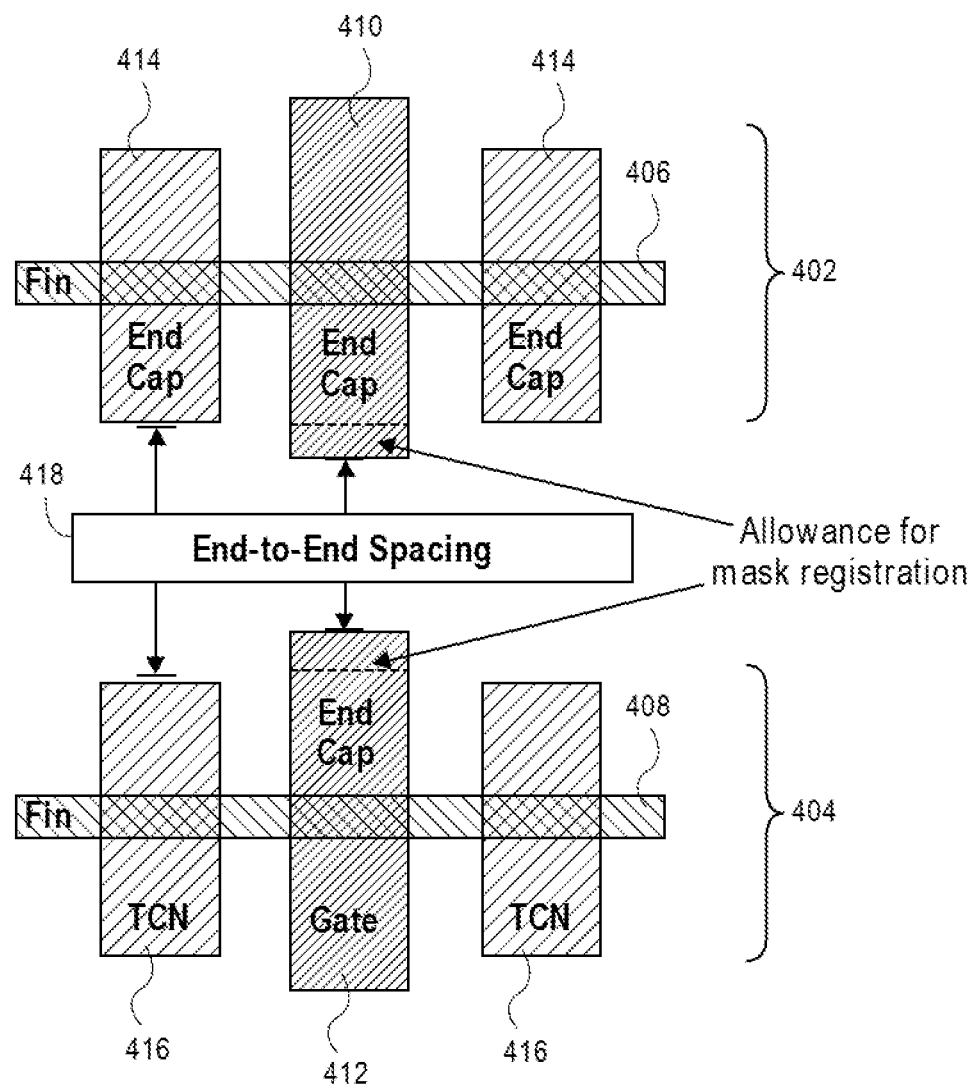
FIG. 4 illustrates a plan view of a layout including fin-based integrated circuit structures accommodating end-to-end spacing.

To provide a foundation for SAGE concepts relevant to embodiments described herein, scaling of gate endcap and trench contact (TCN) endcap regions are important contributors towards improving transistor layout area and density. Gate and TCN endcap regions refer to gate and TCN overlap of the diffusion region/fins of integrated circuit structures. As an example, FIG. 4 illustrates a plan view of a layout 400 including fin-based integrated circuit structures accommodating end-to-end spacing. Referring to FIG. 4, first 402 and second 404 integrated circuit structures are based on semiconductor fins 406 and 408, respectively. Each device 402 and 404 has a gate electrode 410 or 412, respectively. Additionally, each device 402 and 404 has trench contacts (TCNs) 414 and 416, respectively, at source and drain regions of the fins 406 and 408, respectively. The gate electrodes 410 and 412 and the TCNs 414 and 416 each have an end cap region, which is located off of the corresponding fins 406 and 408, respectively.

Referring again to FIG. 4, typically, gate and TCN endcap dimensions must include an allowance for mask registration error to ensure robust transistor operation for worst case mask mis-registration, leaving an end-to-end spacing 418. Thus, another important design rule critical to improving transistor layout density is the spacing between two adjacent endcaps facing each other. However, the parameters of "2*Endcap+End-to-End Spacing" are becoming increasingly difficult to scale using lithographic patterning to meet the scaling requirements for new technologies. In particular, the additional endcap length required to allow for mask registration error also increases gate capacitance values due to longer overlap length between TCN and gate electrodes, thereby increasing product dynamic energy consumption and degrading performance. Previous solutions have focused on improving registration budget and patterning or resolution improvements to enable shrinkage of both endcap dimension and endcap-to-endcap spacing.

In accordance with an embodiment of the present disclosure, approaches are described which provide for self-aligned gate endcap and TCN overlap of a semiconductor fin without any need to allow for mask registration. In one such embodiment, a disposable spacer is fabricated on the semiconductor fin endcaps which determines the gate endcap and the contact overlap dimensions. The spacer defined endcap process enables the gate and TCN endcap regions to be self-aligned to the semiconductor fin and, therefore, does not require extra endcap length to account for mask mis-registration. Furthermore, approaches described herein do not require lithographic patterning at previously required stages since the gate and TCN endcap/overlap dimensions remain fixed, leading to improvement (i.e., reduction) in device to device variability in electrical parameters.

In order to provide a side-by-side comparison, FIGS. 5A-5D illustrate cross-sectional views of process operations of significance in a conventional finFET or tri-gate process fabrication scheme, while FIGS. 6A-6D illustrate cross-sectional views of process operations of significance in a self-aligned gate endcap (SAGE) process fabrication scheme for finFET or tri-gate devices, in accordance with an embodiment of the present disclosure.

Figure 5A:
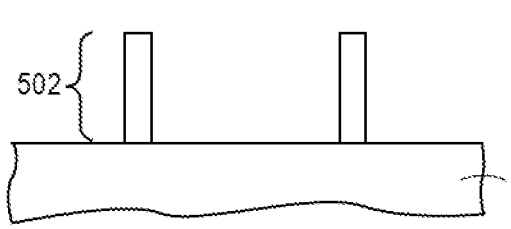
FIGS. 5A-5D illustrate cross-sectional views of process operations of significance in a conventional finFET or tri-gate process fabrication scheme.
Figure 6A:
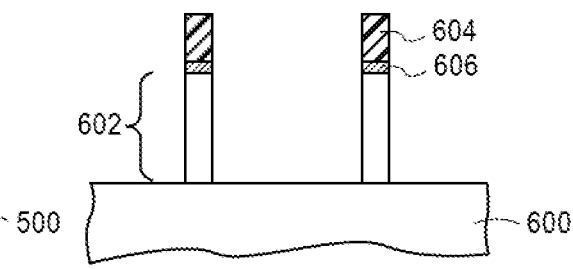
FIGS. 6A-6D illustrate cross-sectional views of process operations of significance in a self-aligned gate endcap (SAGE) process fabrication scheme for finFET or tri-gate devices, in accordance with an embodiment of the present disclosure.

Referring to FIGS. 5A and 6A, a bulk semiconductor substrate 500 or 600, such as a bulk single crystalline silicon substrate is provided having fins 502 or 602, respectively, etched therein. In an embodiment, the fins are formed directly in the bulk substrate 500 or 600 and, as such, are formed continuous with the bulk substrate 500 or 600. It is to be appreciated that within the substrate 500 or 600, shallow trench isolation structures may be formed between fins. Referring to FIG. 6A, a hardmask layer 604, such as a silicon nitride hardmask layer, and a pad oxide layer 606, such as a silicon dioxide layer, remain atop fins 602 following patterning to form the fins 602. By contrast, referring to FIG. 5A, such a hardmask layer and pad oxide layer have been removed.

Figure 5B:
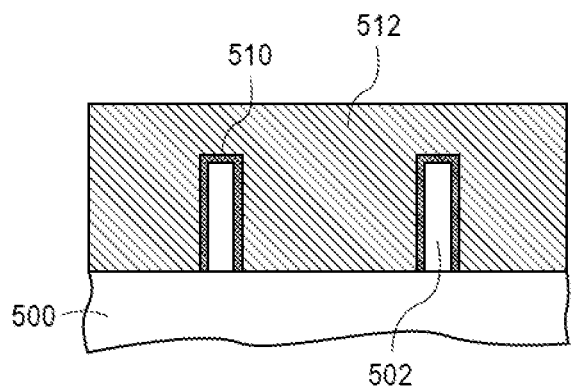
Figure 6B:
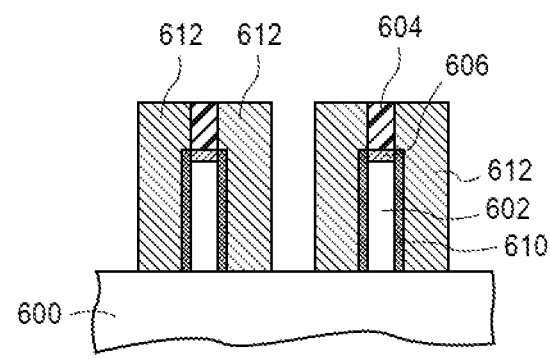

Referring to FIG. 5B, a dummy or permanent gate dielectric layer 510 is formed on the exposed surfaces of the semiconductor fins 502, and a dummy gate layer 512 is formed over the resulting structure. By contrast, referring to FIG. 6B, a dummy or permanent gate dielectric layer 610 is formed on the exposed surfaces of the semiconductor fins 602, and dummy spacers 612 are formed adjacent to the resulting structure.

Figure 5C:
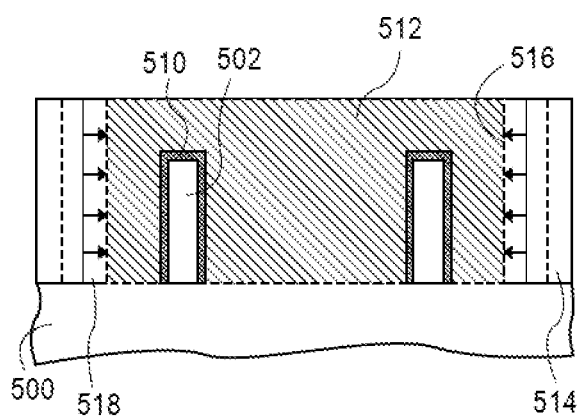

Referring to FIG. 5C, gate endcap cut patterning is performed and isolation regions 514 are formed at the resulting patterned dummy gate ends 516. In the conventional process scheme, a larger gate endcap must be fabricated to allow for gate mask mis-registration, as depicted by the arrowed regions 518. By contrast, referring to FIG. 6C, self-aligned isolation regions 614 are formed by providing an isolation layer over the structure of FIG. 6B, e.g., by deposition and planarization. In one such embodiment, the self-aligned gate endcap process does not require extra space for mask registration, as compared in FIGS. 5C and 6C.

Figure 5D:
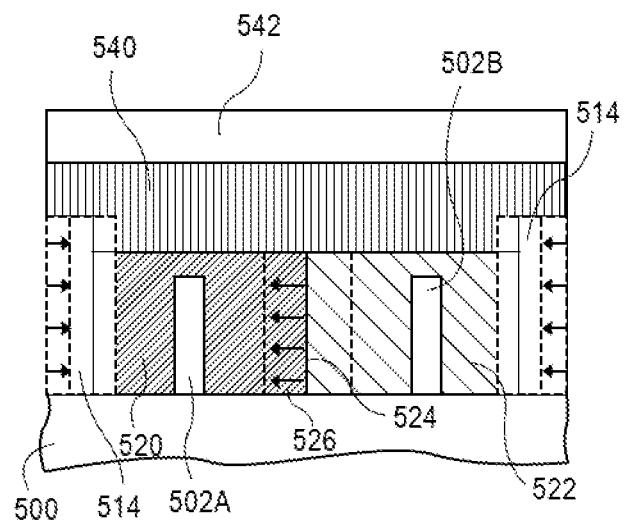

Referring to FIG. 5D, the dummy gate electrode 512 of FIG. 5C is replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 520 over a first semiconductor fin 502A and to provide a P-type gate electrode 522 over a second semiconductor fin 502B. The N-type gate electrode 520 and the P-type gate electrode 522 are formed between the gate endcap isolations structures 514, but form a P/N junction 524 where they meet. The exact location of the P/N junction 524 may vary, depending on mis-registration, as depicted by the arrowed region 526.

Figure 6C:
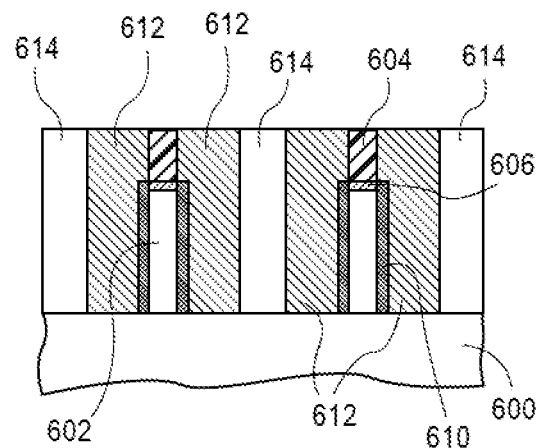
Figure 6D:
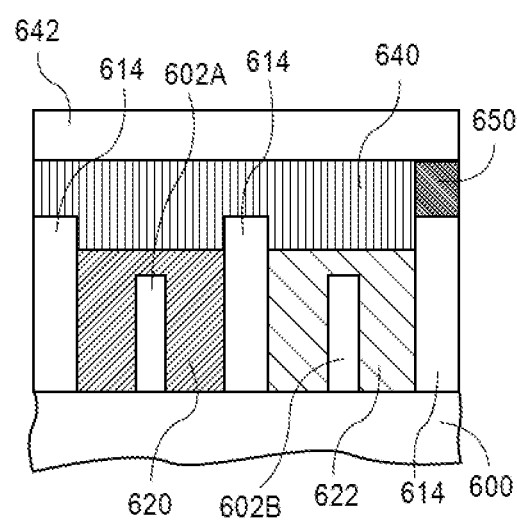

By contrast, referring to FIG. 6D, the hardmask layer 604 and pad oxide layer 606 are removed, and the dummy spacers 614 of FIG. 6C are replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 620 over a first semiconductor fin 602A and to provide a P-type gate electrode 622 over a second semiconductor fin 602B. The N-type gate electrode 620 and the P-type gate electrode 622 are formed between, and are also separated by, the gate endcap isolations structures 614.

Referring again to FIG. 5D, a local interconnect 540 may be fabricated to contact N-type gate electrode 520 and P-type gate electrode 522 to provide a conductive path around the P/N junction 524. Likewise, referring to FIG. 6D, a local interconnect 640 may be fabricated to contact N-type gate electrode 620 and P-type gate electrode 622 to provide a conductive path over the intervening isolation structure 614 there between. Referring to both FIGS. 5D and 6D, a hardmask 542 or 642 may be formed on the local interconnect 540 or 640, respectively. Referring to FIG. 6D in particular, in an embodiment, the continuity of the local interconnect 640 is interrupted by a dielectric plug 650 in cases where a break in electrical contact along a gate line are needed. As used, herein, the term "plug" is used to refer to a non-conductive space or interruption of a metal or otherwise conductive structure, such as an interruption of a local interconnect feature.

In accordance with one or more embodiments of the present disclosure, a self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Furthermore, a flexible fin-height (e.g., multi Hsi) process may enable independent optimization of different cells for power and performance. An integrated process flow enabling both features may be implemented to meet scaling and performance challenges for future CMOS technology. Embodiments described herein may involve the fabrication of gate endcap isolation structures, which may also be referred to as gate walls or SAGE walls.

More generally, one or more embodiments described herein provide an avenue for area scaling, reducing capacitance, and/or eliminating various critical front end masks, such as gate cut masks. In one such embodiment the width of a minimum transistor can be reduced by up to 30% by implementing one or more of the approaches describe herein. The smaller transistor size reduces the capacitance between the gate and TCN and other parasitic capacitances. In one embodiment, no extra mask operations are needed to create the endcaps, contacts and local interconnect lines so the many masks needed for such features in the standard process are eliminated.

More specifically, key features of one or more embodiments described above may include one or more of: (1) the gate endcap is the distance from the fin endcap to the isolation endcap. This distance is defined by the spacer width and is the same size for all transistors. No lithographic patterning is needed to define the endcap so there is no need to allow for mask registration in the endcap; (2) The TCN overlap of the fin is determined by the spacer width and is also not affected by mask registration. Embodiments may be applicable to the 7 nm node generation, e.g., to improve transistor layout density and gate capacitance (dynamic energy and performance improvement) and reduce total mask count. It is to be appreciated that the structures resulting from the above exemplary processing schemes may be used in a same or similar form for subsequent processing operations to complete device fabrication, such as PMOS and NMOS device fabrication.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

In an embodiment, as described throughout, self-aligned gate endcap isolation structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide. It is to be appreciated that, SAGE walls of varying width may be fabricated, e.g., to provide relatively narrow SAGE walls and relatively wide SAGE walls. It is also to be appreciated that fabrication of gate endcap isolation structures may lead to formation of a seam within the gate endcap isolation structures. It is also to be appreciated that gate endcap isolation structures may differ depending on the spacing of adjacent fins.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. Thus, contact over active gate (COAG) structures may be fabricated. One or more embodiments of the present disclosure are directed to semiconductor structures or devices having one or more gate contact structures (e.g., as gate contact vias) disposed over active portions of gate electrodes of the semiconductor structures or devices. One or more embodiments of the present disclosure are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In one or more embodiments, the gate contact structures fabricated to contact the gate electrodes are self-aligned via structures.

More generally, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact (GCN) layer to conduct signals from a gate line or structure. In an embodiment, eliminating the above features is achieved by recessing contact metals in a trench contact (TCN) and introducing an additional dielectric material in the process flow (e.g., TILA). The additional dielectric material is included as a trench contact dielectric cap layer with etch characteristics different from the gate dielectric material cap layer already used for trench contact alignment in a gate aligned contact process (GAP) processing scheme (e.g., GILA). However, in technologies where space and layout constraints are somewhat relaxed compared with current generation space and layout constraints, a contact to gate structure may be fabricated by making contact to a portion of the gate electrode disposed over an isolation region.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) technology node sub-10 nanometer (10 nm) technology node.

Additional or intermediate operations for FEOL layer or structure fabrication (or BEOL layer or structure fabrication) may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

In an embodiment, as described throughout, an integrated circuit structure includes non-planar devices such as, but not limited to, a finFET or a tri-gate device. The non-planar devices may further include corresponding one or more overlying nanowire structures above the finFET or a tri-gate device. In such an embodiment, a corresponding semiconducting channel region is composed of or is formed in a three-dimensional body with one or more discrete nanowire channel portions overlying the three-dimensional body. In one such embodiment, the gate structures surround at least a top surface and a pair of sidewalls of the three-dimensional body, and further surrounds each of the one or more discrete nanowire channel portions.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
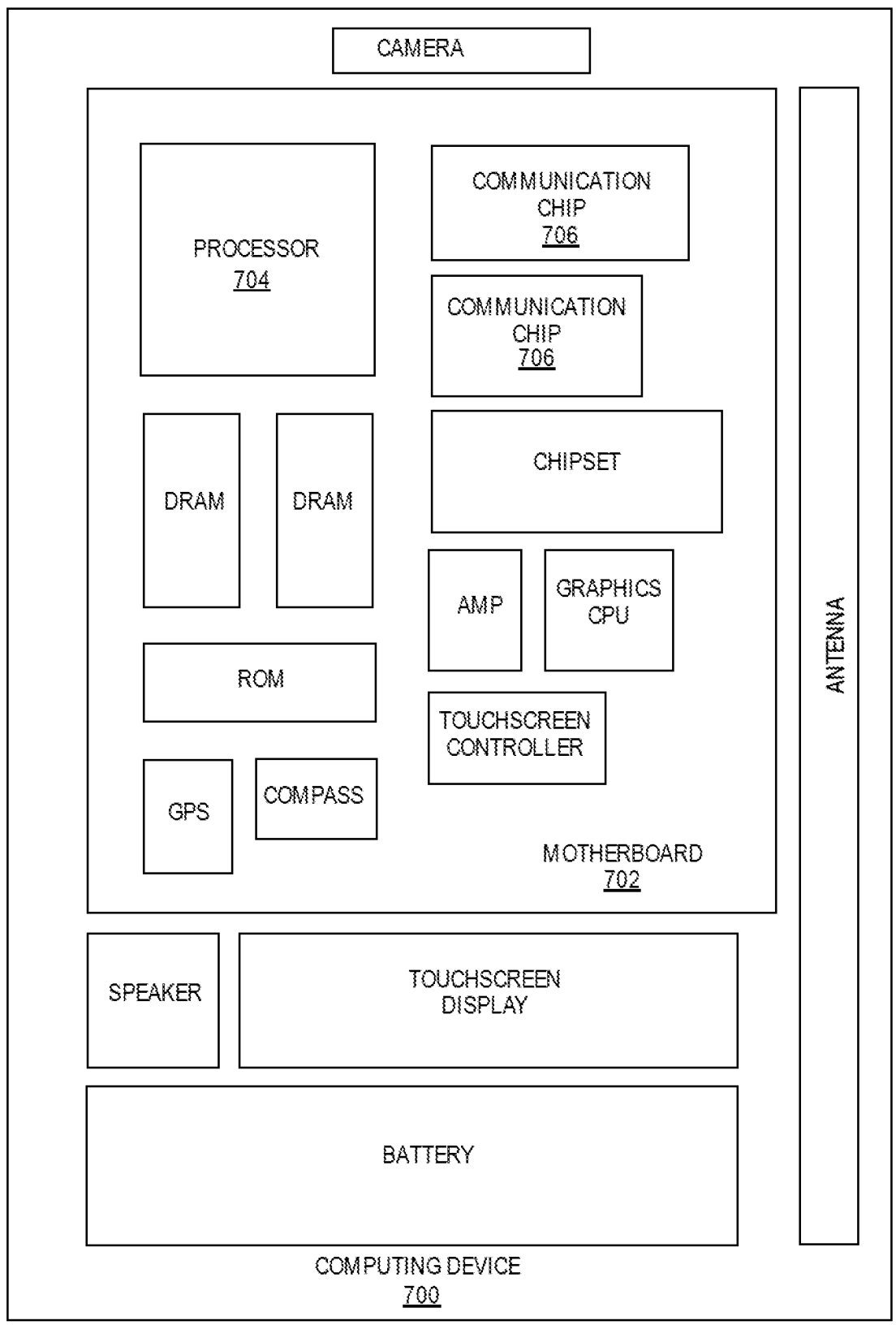
FIG. 7 illustrates a computing device in accordance with one implementation of the disclosure.

FIG. 7 illustrates a computing device 700 in accordance with one implementation of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 706 also includes an integrated circuit die packaged within the communication chip 706. In accordance with another implementation of the disclosure, the integrated circuit die of the communication chip is built in accordance with implementations of the disclosure.

In further implementations, another component housed within the computing device 700 may contain an integrated circuit die built in accordance with implementations of embodiments of the disclosure.

In various embodiments, the computing device 700 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
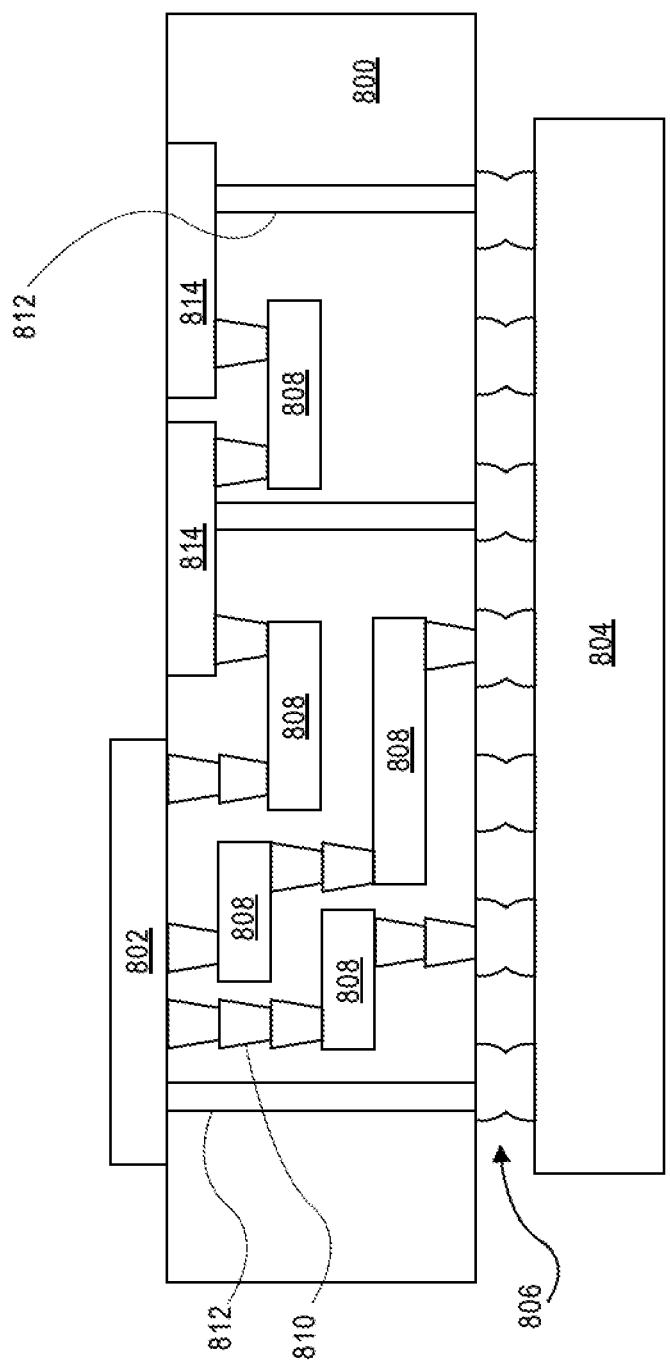
FIG. 8 illustrates an interposer that includes one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800 or in the fabrication of components included in the interposer 800.

Figure 9:
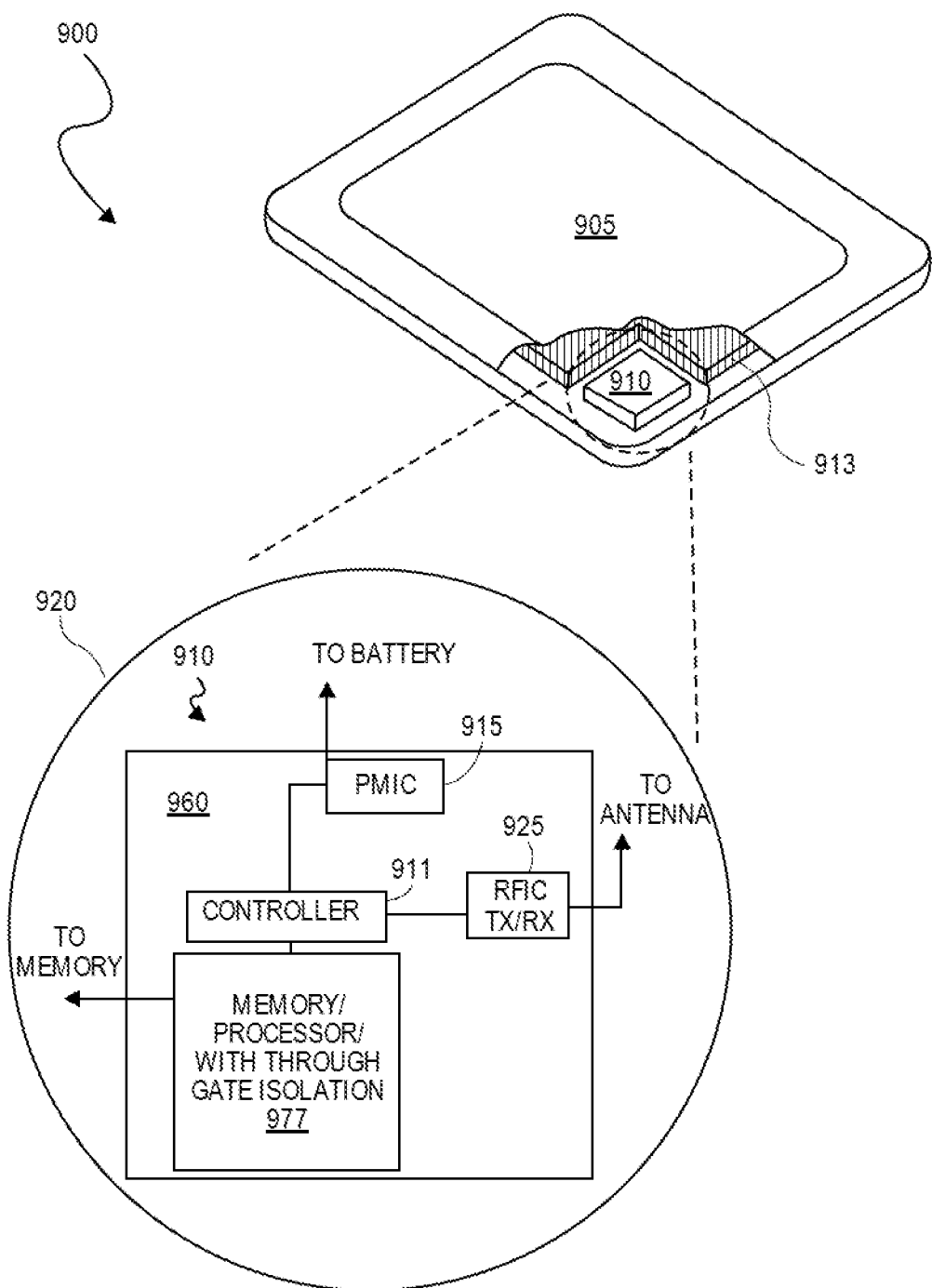
FIG. 9 is an isometric view of a mobile computing platform employing an IC fabricated according to one or more processes described herein or including one or more features described herein, in accordance with an embodiment of the present disclosure.

FIG. 9 is an isometric view of a mobile computing platform 900 employing an integrated circuit (IC) fabricated according to one or more processes described herein or including one or more features described herein, in accordance with an embodiment of the present disclosure.

The mobile computing platform 900 may be any portable device configured for each of electronic data display, electronic data processing, and wireless electronic data transmission. For example, mobile computing platform 900 may be any of a tablet, a smart phone, laptop computer, etc. and includes a display screen 905 which in the exemplary embodiment is a touchscreen (capacitive, inductive, resistive, etc.), a chip-level (SoC) or package-level integrated system 910, and a battery 913. As illustrated, the greater the level of integration in the system 910 enabled by higher transistor packing density, the greater the portion of the mobile computing platform 900 that may be occupied by the battery 913 or non-volatile storage, such as a solid state drive, or the greater the transistor gate count for improved platform functionality. Similarly, the greater the carrier mobility of each transistor in the system 910, the greater the functionality. As such, techniques described herein may enable performance and form factor improvements in the mobile computing platform 900.

The integrated system 910 is further illustrated in the expanded view 920. In the exemplary embodiment, packaged device 977 includes at least one memory chip (e.g., RAM), or at least one processor chip (e.g., a multi-core microprocessor and/or graphics processor) fabricated according to one or more processes described herein or including one or more features described herein. The packaged device 977 is further coupled to the board 960 along with one or more of a power management integrated circuit (PMIC) 915, RF (wireless) integrated circuit (RFIC) 925 including a wideband RF (wireless) transmitter and/or receiver (e.g., including a digital baseband and an analog front end module further including a power amplifier on a transmit path and a low noise amplifier on a receive path), and a controller thereof 911. Functionally, the PMIC 915 performs battery power regulation, DC-to-DC conversion, etc., and so has an input coupled to the battery 913 and with an output providing a current supply to all the other functional modules. As further illustrated, in the exemplary embodiment, the RFIC 925 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 977 or within a single IC (SoC) coupled to the package substrate of the packaged device 977.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 10:
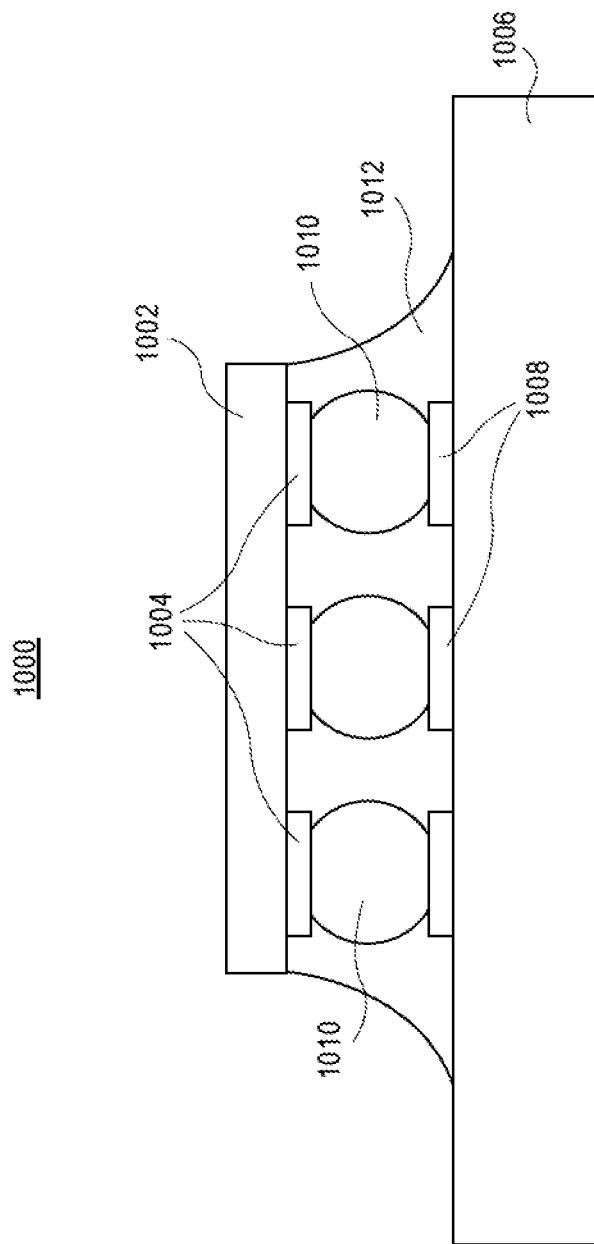
FIG. 10 illustrates a cross-sectional view of a flip-chip mounted die, in accordance with an embodiment of the present disclosure.

FIG. 10 illustrates a cross-sectional view of a flip-chip mounted die, in accordance with an embodiment of the present disclosure.

Referring to FIG. 10, an apparatus 1000 includes a die 1002 such as an integrated circuit (IC) fabricated according to one or more processes described herein or including one or more features described herein, in accordance with an embodiment of the present disclosure. The die 1002 includes metallized pads 1004 thereon. A package substrate 1006, such as a ceramic or organic substrate, includes connections 1008 thereon. The die 1002 and package substrate 1006 are electrically connected by solder balls 1010 coupled to the metallized pads 1004 and the connections 1008. An underfill material 1012 surrounds the solder balls 1010.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include advanced integrated circuit structure fabrication.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a gate structure over a semiconductor fin. A gate endcap isolation structure is laterally adjacent to and in contact with the gate structure. A trench contact structure is over the semiconductor fin, where the gate endcap isolation structure is laterally adjacent to and in contact with the trench contact structure. A local gate-to-contact interconnect is electrically connecting the gate structure to the trench contact structure.

Example embodiment 2: The integrated circuit structure of example embodiment 1, further including a gate plug over the gate endcap isolation structure, the gate plug laterally adjacent to and in contact with the gate structure.

Example embodiment 3: The integrated circuit structure of example embodiment 2, wherein the gate plug has an uppermost surface co-planar with an uppermost surface of the local gate-to-contact interconnect.

Example embodiment 4: The integrated circuit structure of example embodiment 2 or 3, wherein the gate plug is vertically misaligned with the gate endcap isolation structure.

Example embodiment 5: The integrated circuit structure of example embodiment 2, 3 or 4, wherein the gate plug has a width greater than a width of the gate endcap isolation structure.

Example embodiment 6: The integrated circuit structure of example embodiment 1, 2, 3, 4 or 5, wherein the local gate-to-contact interconnect is continuous with the trench contact structure.

Example embodiment 7: The integrated circuit structure of example embodiment 1, 2, 3, 4, 5 or 6, wherein the gate structure includes a local gate contact, and wherein the local gate-to-contact interconnect is on the local gate contact.

Example embodiment 8: The integrated circuit structure of example embodiment 1, 2, 3, 4, 5, 6 or 7, further including a trench contact plug over the gate endcap isolation structure, the trench contact plug laterally adjacent to and in contact with the trench contact structure.

Example embodiment 9: The integrated circuit structure of example embodiment 1, 2, 3, 4, 5, 6, 7 or 8, wherein the semiconductor fin protrudes through a trench isolation region above a substrate, and wherein the gate endcap isolation structure is on the trench isolation region.

Example embodiment 10: An integrated circuit structure includes a first gate structure over a first semiconductor fin. A second gate structure is over a second semiconductor fin. A gate endcap isolation structure is between the first and second semiconductor fins and laterally between and in contact with the first and second gate structures. A first trench contact structure is over the first semiconductor fin. A second trench contact structure is over the second semiconductor fin, the gate endcap isolation structure laterally between and in contact with the first trench contact structure and the second trench contact structure. A local gate-to-contact interconnect is electrically connecting the first gate structure to the first trench contact structure.

Example embodiment 11: The integrated circuit structure of example embodiment 10, further including a gate plug over the gate endcap isolation structure and laterally between and in contact with the first and second gate structures.

Example embodiment 12: The integrated circuit structure of example embodiment 11, wherein the gate plug has an uppermost surface co-planar with an uppermost surface of the local gate-to-contact interconnect.

Example embodiment 13: The integrated circuit structure of example embodiment 11 or 12, wherein the gate plug is vertically misaligned with the gate endcap isolation structure.

Example embodiment 14: The integrated circuit structure of example embodiment 11, 12 or 13, wherein the gate plug has a width greater than a width of the gate endcap isolation structure.

Example embodiment 15: The integrated circuit structure of example embodiment 10, 11, 12, 13 or 14, wherein the local gate-to-contact interconnect is continuous with the first trench contact structure.

Example embodiment 16: The integrated circuit structure of example embodiment 10, 11, 12, 13, 14 or 15, wherein the first gate structure includes a local gate contact, and wherein the local gate-to-contact interconnect is on the local gate contact.

Example embodiment 17: The integrated circuit structure of example embodiment 10, 11, 12, 13, 14, 15 or 16, further including a trench contact plug over the gate endcap isolation structure and laterally between and in contact with the first and second trench contact structures.

Example embodiment 18: The integrated circuit structure of example embodiment 10, 11, 12, 13, 14, 15, 16 or 17, wherein the first and second semiconductor fins protrude through a trench isolation region above a substrate, and wherein the gate endcap isolation structure is on the trench isolation region.

Example embodiment 19: A computing device includes a board and a component coupled to the board. The component includes an integrated circuit structure including a gate structure over a semiconductor fin. A gate endcap isolation structure is laterally adjacent to and in contact with the gate structure. A trench contact structure is over the semiconductor fin, where the gate endcap isolation structure is laterally adjacent to and in contact with the trench contact structure. A local gate-to-contact interconnect is electrically connecting the gate structure to the trench contact structure.

Example embodiment 20: The computing device of example embodiment 19, further including a memory coupled to the board.

Example embodiment 21: The computing device of example embodiment 19 or 20, further including a communication chip coupled to the board.

Example embodiment 22: The computing device of example embodiment 19, 20 or 21, further including a camera coupled to the board.

Example embodiment 23: The computing device of example embodiment 19, 20, 21 or 22, further including a battery coupled to the board.

Example embodiment 24: The computing device of example embodiment 19, 20, 21, 22 or 23, further including an antenna coupled to the board.

Example embodiment 25: The computing device of example embodiment 19, 20, 21, 22, 23 or 24, wherein the component is a packaged integrated circuit die.

What is claimed is:

1. An integrated circuit structure, comprising:
   a gate structure surrounding a channel region of a semiconductor nanowire;
   a gate endcap isolation structure laterally adjacent to and in contact with the gate structure;
   a trench contact structure above the semiconductor nanowire, wherein the gate endcap isolation structure is laterally adjacent to and in contact with the trench contact structure; and
   a local gate-to-contact interconnect electrically connecting the gate structure to the trench contact structure.

2. The integrated circuit structure of claim 1, further comprising:
   a gate plug over the gate endcap isolation structure, the gate plug laterally adjacent to and in contact with the gate structure.

3. The integrated circuit structure of claim 2, wherein the gate plug has an uppermost surface co-planar with an uppermost surface of the local gate-to-contact interconnect.

4. The integrated circuit structure of claim 2, wherein the gate plug is vertically misaligned with the gate endcap isolation structure.

5. The integrated circuit structure of claim 2, wherein gate plug has a width greater than a width of the gate endcap isolation structure.

6. The integrated circuit structure of claim 1, wherein the local gate-to-contact interconnect is continuous with the trench contact structure.

7. The integrated circuit structure of claim 1, wherein the gate structure comprises a local gate contact, and wherein the local gate-to-contact interconnect is on the local gate contact.

8. The integrated circuit structure of claim 1, further comprising:
   a trench contact plug over the gate endcap isolation structure, the trench contact plug laterally adjacent to and in contact with the trench contact structure.

9. The integrated circuit structure of claim 1, wherein the gate endcap isolation structure is on a trench isolation region.

10. An integrated circuit structure, comprising:
    a first gate structure surrounding a channel region of a first semiconductor nanowire;
    a second gate structure surrounding a channel region of a second semiconductor nanowire;
    a gate endcap isolation structure between the first and second semiconductor nanowires and laterally between and in contact with the first and second gate structures;
    a first trench contact structure above the first semiconductor nanowire;
    a second trench contact structure above the second semiconductor nanowire, the gate endcap isolation structure laterally between and in contact with the first trench contact structure and the second trench contact structure; and
    a local gate-to-contact interconnect electrically connecting the first gate structure to the first trench contact structure.

11. The integrated circuit structure of claim 10, further comprising:
    a gate plug over the gate endcap isolation structure and laterally between and in contact with the first and second gate structures.

12. The integrated circuit structure of claim 11, wherein the gate plug has an uppermost surface co-planar with an uppermost surface of the local gate-to-contact interconnect.

13. The integrated circuit structure of claim 11, wherein the gate plug is vertically misaligned with the gate endcap isolation structure.

14. The integrated circuit structure of claim 11, wherein the gate plug has a width greater than a width of the gate endcap isolation structure.

15. The integrated circuit structure of claim 10, wherein the local gate-to-contact interconnect is continuous with the first trench contact structure.

16. The integrated circuit structure of claim 10, wherein the first gate structure comprises a local gate contact, and wherein the local gate-to-contact interconnect is on the local gate contact.

17. The integrated circuit structure of claim 10, further comprising:
   a trench contact plug over the gate endcap isolation structure and laterally between and in contact with the first and second trench contact structures.

18. The integrated circuit structure of claim 10, wherein the gate endcap isolation structure is on a trench isolation region.

19. A computing device, comprising:
   a board; and
   a component coupled to the board, the component including an integrated circuit structure, comprising:
      a gate structure surrounding a channel region of a semiconductor nanowire;
      a gate endcap isolation structure laterally adjacent to and in contact with the gate structure;
      a trench contact structure above the semiconductor nanowire, wherein the gate endcap isolation structure is laterally adjacent to and in contact with the trench contact structure; and
      a local gate-to-contact interconnect electrically connecting the gate structure to the trench contact structure.

20. The computing device of claim 19, further comprising:
   a memory coupled to the board.

21. The computing device of claim 19, further comprising:
   a communication chip coupled to the board.

22. The computing device of claim 19, further comprising:
   a camera coupled to the board.

23. The computing device of claim 19, further comprising:
   a battery coupled to the board.

24. The computing device of claim 19, further comprising:
   an antenna coupled to the board.

25. The computing device of claim 19, wherein the component is a packaged integrated circuit die.

* * * * *